(12) United States Patent
Kitano et al.

(10) Patent No.: US 10,908,020 B2
(45) Date of Patent: Feb. 2, 2021

(54) LIGHT SOURCE DEVICE AND METHOD FOR DRIVING LIGHT SOURCE DEVICE

(71) Applicant: INTER ACTION CORPORATION, Yokohama (JP)

(72) Inventors: Hiroyuki Kitano, Yokohama (JP); Katsuya Suzuki, Yokohama (JP); Hiromi Yamamoto, Yokohama (JP)

(73) Assignee: INTER ACTION CORPORATION, Kanagawa (JP)

( * ) Notice: Subject to any disclaimer, the term of this patent is extended or adjusted under 35 U.S.C. 154(b) by 187 days.

(21) Appl. No.: 16/091,280

(22) PCT Filed: Jun. 28, 2017

(86) PCT No.: PCT/JP2017/023728
§ 371 (c)(1),
(2) Date: Oct. 4, 2018

(87) PCT Pub. No.: WO2018/034066
PCT Pub. Date: Feb. 22, 2018

(65) Prior Publication Data
US 2019/0128736 A1    May 2, 2019

(30) Foreign Application Priority Data
Aug. 18, 2016 (JP) .................. 2016-160694

(51) Int. Cl.
*G01J 3/02* (2006.01)
*G01J 3/46* (2006.01)
(Continued)

(52) U.S. Cl.
CPC .............. *G01J 3/0275* (2013.01); *G01F 1/00* (2013.01); *G01J 3/46* (2013.01); *G01J 3/50* (2013.01);
(Continued)

(58) Field of Classification Search
CPC ... G01F 1/00; G01J 3/0275; G01J 3/46; G01J 3/50; G01J 3/505; G02B 26/007; G02B 7/006; H01L 27/144
See application file for complete search history.

(56) References Cited

U.S. PATENT DOCUMENTS 5,159,185 A    10/1992 Lehr
2006/0214673 A1    9/2006 Tamai
(Continued)

FOREIGN PATENT DOCUMENTS

DE    10 2010 002570 A1    7/2011
EP    1568983 A1    8/2005
(Continued)

OTHER PUBLICATIONS

International Search Report dated Sep. 19, 2017, issued in counterpart application No. PCT/JP2017/023728 (2 pages).
Extended (Supplementary) European Search Report dated Mar. 31, 2020, issued in counterpart EP application No. 17841294.6. (14 pages).

*Primary Examiner* — Hina F Ayub
(74) *Attorney, Agent, or Firm* — Westerman, Hattori, Daniels & Adrian, LLP

(57) ABSTRACT

A light source device 100 has a light source 101 which emits light to be irradiated, a chromaticity measurement part (spectrometer) 109 for measuring the chromaticity of the emitted light emitted by the light source, a chromaticity adjustment part 120 capable of placing/removing chromaticity adjustment-use filters CHA and CHB onto/from the light path LP of the emitted light and capable of adjusting the chromaticity of the emitted light by placement/removal of the chromaticity adjustment-use filters, and a control part 400 which monitors a change of the chromaticity of the emitted light according to the results of measurement of the chromaticity measurement part and controls placement/removal of the chromaticity adjustment-use filters of the chromaticity adjustment part onto/from the light path LP so (Continued)

that the chromaticity becomes the chromaticity which is set in advance as a target. Due to this, the light source device 100 can emit light having the same color even in the face of changes along with the elapse of time and variations in the specifications of the optical parts.

13 Claims, 11 Drawing Sheets

(51) Int. Cl.
*G01J 3/50* (2006.01)
*G02B 7/00* (2006.01)
*G02B 26/00* (2006.01)
*G01F 1/00* (2006.01)
*H01L 27/144* (2006.01)

(52) U.S. Cl.
CPC .............. *G01J 3/505* (2013.01); *G02B 7/006* (2013.01); *G02B 26/007* (2013.01); *H01L 27/144* (2013.01)

(56) References Cited

U.S. PATENT DOCUMENTS

| | | | |
|---|---|---|---|
| 2012/0126707 A1 | 5/2012 | Kropf | |
| 2015/0373808 A1* | 12/2015 | Kuo | G01J 1/0411 |
| | | | 315/158 |
| 2017/0345391 A1* | 11/2017 | Usui | G09G 3/001 |
| 2017/0356608 A1* | 12/2017 | Smith | F21V 9/40 |

FOREIGN PATENT DOCUMENTS

| | | |
|---|---|---|
| JP | 58-87433 A | 5/1983 |
| JP | 60-46441 A | 3/1985 |
| JP | 5-93654 A | 4/1993 |
| JP | 2003-121367 A | 4/2003 |
| JP | 2004-266250 A | 9/2004 |
| JP | 2009-276108 A | 11/2009 |
| JP | 2013-137265 A | 7/2013 |
| WO | 2004/053451 A1 | 6/2004 |
| WO | 2007/018969 A2 | 2/2007 |

\* cited by examiner

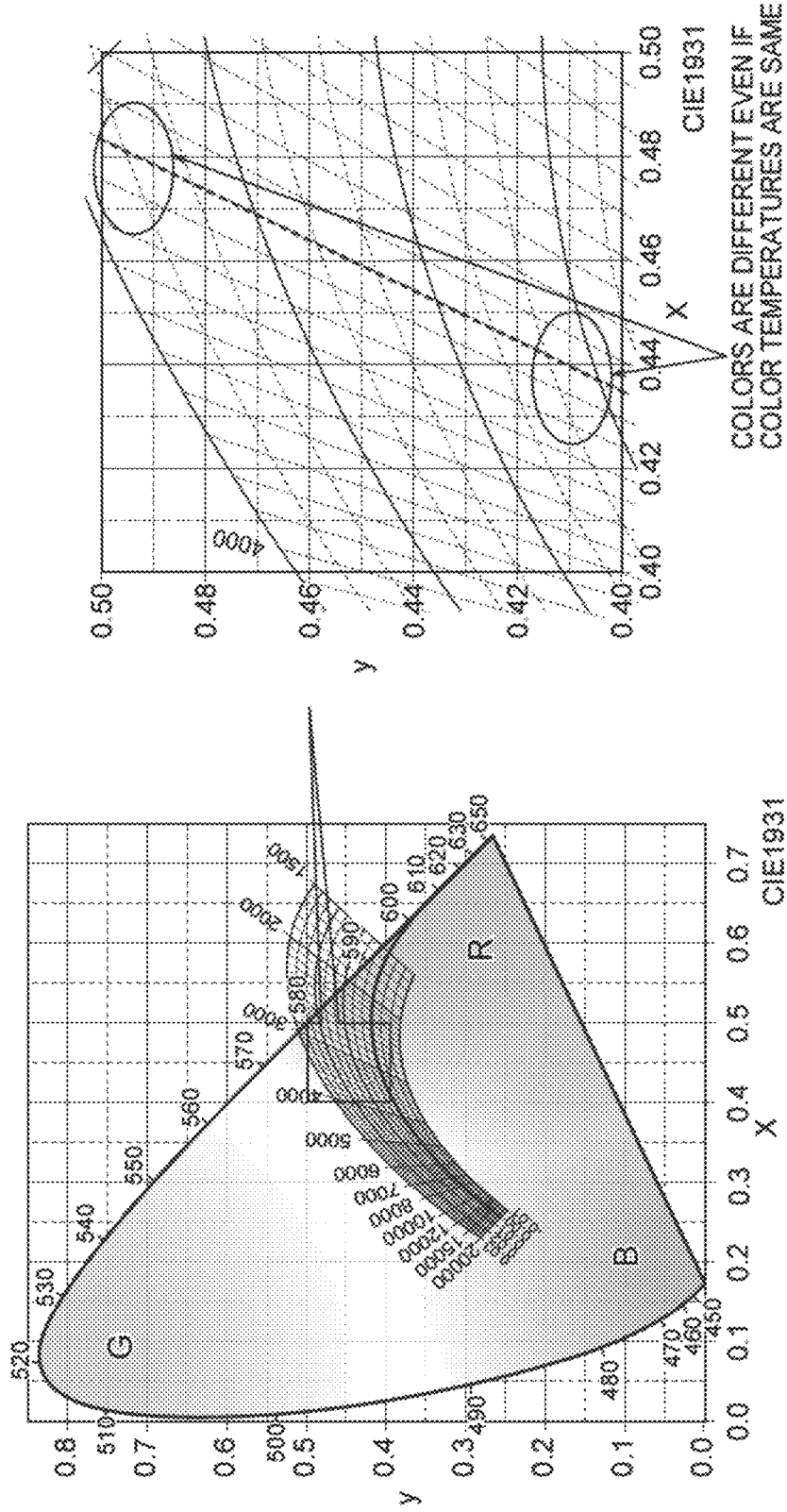

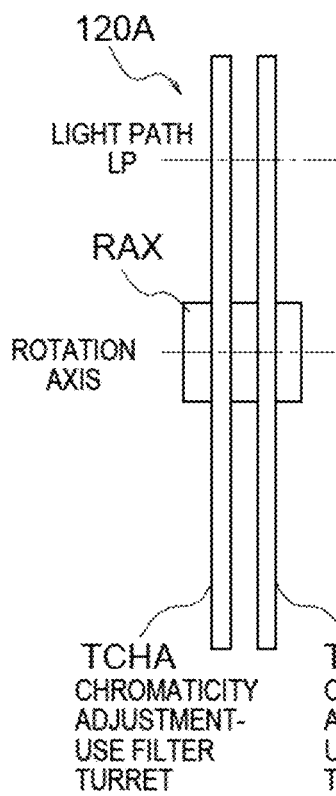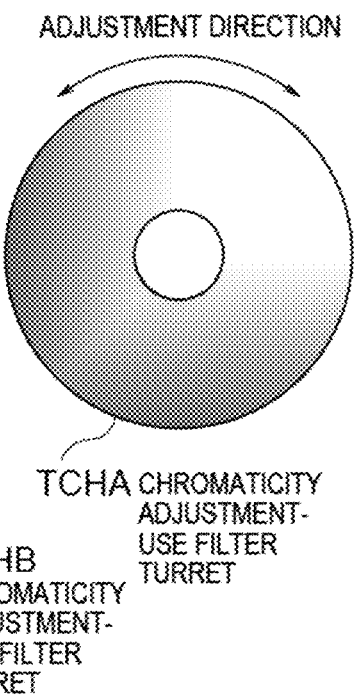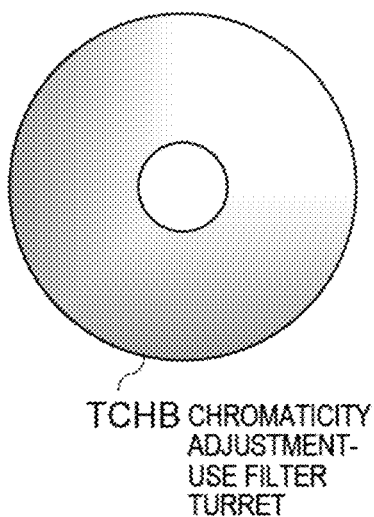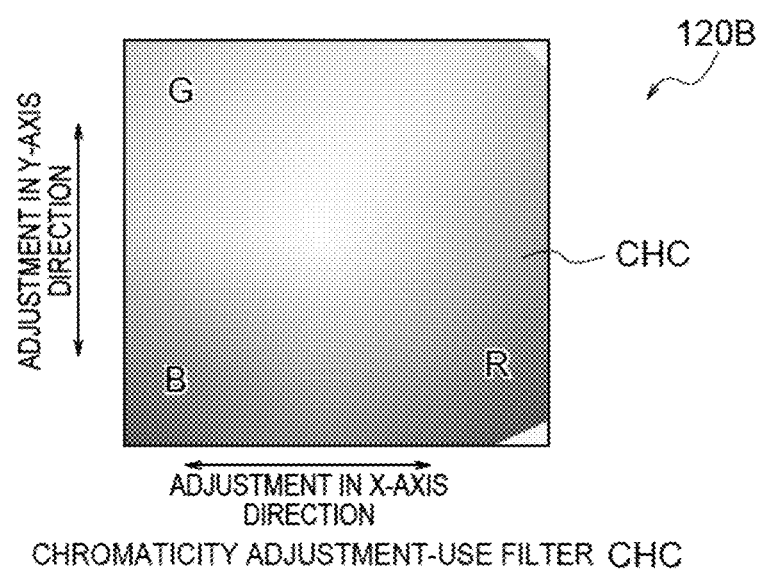

LIGHT SOURCE DEVICE AND METHOD FOR DRIVING LIGHT SOURCE DEVICE

TECHNICAL FIELD

The present invention relates to a light source device applied to for example inspection of a solid-state imaging device and a method for driving the light source device.

BACKGROUND ART

As a solid-state imaging device (image sensor) using a photoelectric conversion element which detects light and generates a charge, a CCD (charge coupled device) and CMOS (complementary metal oxide semiconductor) image sensor have been put into practical use.

In a manufacturing process of a CCD or CMOS or other solid-state imaging device, it is necessary to inspect (test) the photoelectric conversion characteristics of the solid-state imaging device. This inspection includes a pre-process inspection (test) which is carried out in a chip state where the solid-state imaging device is formed on a semiconductor wafer and a post-process inspection (test) which is carried out after assembly and packaging of the solid-state imaging device.

In the pre-process test, for example, a test head and a solid-state imaging device are electrically connected by using a probe card. In this state, a light receiving surface of the solid-state imaging device is irradiated by light for inspection use through a predetermined optical system (optical device) having a pin hole.

In the post-process test, for example, a solid-state imaging device packaged by a handler is mounted on a socket board to electrically connect the test head and the solid-state imaging device. In this state, the light receiving surface of the solid-state imaging device is irradiated by light for inspection use through a predetermined optical system (optical device) having a pin hole.

FIG. 1 is a view showing an example of the configuration of a light source device applied to the inspection of a solid-state imaging device (see for example PTL 1).

A light source device 1 in FIG. 1 has a light source head 2, a lens barrel 3, and a control part 4. Further, in a light irradiation region of the lens barrel 3, a wafer table 5 on which the wafer to be inspected is mounted is arranged. A wafer mounting surface 5a of the wafer table 5 is vertical relative to the light path of the optical system of the lens barrel 3.

The light source head 2 includes a light source 11 and, arranged along the transmission light path LP (TLP) of the light (white light) emitted by the light source 11, a condenser lens 12, mechanical slit 13, ND filter turret 14, color correction filter turret 15, half mirror 16, homogenizer 17, and illuminometer 18.

As the light source 11, for example, a halogen lamp, xenon lamp, metal halide lamp, LED, laser, or the like is applied. This light source 11 reflects and focuses the emitted light to a predetermined direction. The half mirror 16 reflects the light in a predetermined wavelength region in the light from the light source 11 which is propagated over the light path LP to form a reflection light path RLP and passes the light in the remaining wavelength region through it to form a transmission light path TLP.

The lens barrel 3 includes a homogenizer 19, convex lens 20, and concave lens 21 which are arranged so as to make their optical axes match with the reflection light path RLP formed by the half mirror 16 in the light source head 2.

The homogenizers 17 and 19 are respectively configured by fly-eye lenses in which single lenses are vertically and horizontally arrayed in a matrix or the like and are provided so as to make the distribution of illuminance of the light from the light source 11 uniform.

In the light source device 1 having such a configuration, the mechanical slit (mechanical aperture) 13 and the ND filter turret 14 which are located on the light path LP are combined in order to emit light having a designated illuminance.

Further, a halogen lamp used as the light source 11 ends up falling in illuminance along with the elapse of time. Therefore, in the light source device 1, in order to maintain the illuminance, an illuminometer 18 is provided inside the light source head 2 as a sensor for measuring the illuminance. Further, by using the results of measurement of the illuminometer 18 in the control part 4 to judge whether the illuminance has reached the target and providing feedback for a driving voltage DV of the lamp of the light source 11 so that the same value is always obtained, it is possible to maintain the same illuminance.

Further, in the light source device 1, in order to change the color of the light, a transmission type filter is arranged on the light path LP to change the color of the light as a whole. Further, in the light source device 1, in order to eliminate variation in color of inspection light due to different optical parts, the lamp voltage is adjusted. The driving voltage DV is adjusted so that all devices have the same color temperature.

CITATION LIST

Patent Literature

PTL 1: JP WO2004/053451 A1

SUMMARY OF INVENTION

Technical Problem

However, in the light source device 1 described above, the mechanical slit (mechanical aperture) 13 and the ND filter turret 14 located on the light path LP are combined so as to emit light having the designated illuminance, but if the mechanical slit 13 is switched, the appearance of the light source ends up changing resulting in a change of the color of the light.

Further, the driving voltage DV of the lamp is adjusted to deal with change of the illuminance of the halogen lamp used as the light source 11 along with the elapse of time, but the change of the color of the light along with the elapse of time cannot be prevented. The color of the light as a whole can be changed by providing a transmission type filter. However, fine adjustment is difficult due to the variation in individual filters.

The driving voltage of the lamp is adjusted so as to obtain the same color temperature in order to try to eliminate variation of color among devices. However, the color of light will differ even if the color temperature is the same, therefore the colors of light source devices cannot always be made the same. In this case, the variation of color among the parts is corrected by the voltage so as to try to obtain the same color temperature. However, again, the colors will differ even if the color temperature is the same, therefore the variation of color cannot be completely eliminated.

The present invention provides a light source device capable of emitting light having the same color even in the face of changes along with the elapse of time and variations in the specifications of the optical parts and provides a method for driving such a light source device.

Solution to Problem

A first aspect of the present invention is a light source device for irradiating a target with light, comprising a light source which emits light to be irradiated, a chromaticity measurement part for measuring the chromaticity of the emitted light emitted by the light source, a chromaticity adjustment part capable of placing/removing a chromaticity adjustment-use filter onto/from the light path of the emitted light and capable of adjusting the chromaticity of the emitted light by placement/removal of the chromaticity adjustment-use filter, and a control part which monitors a change of the chromaticity of the emitted light according to the results of measurement of the chromaticity measurement part and controls placement/removal of the chromaticity adjustment-use filter of the chromaticity adjustment part onto/from the light path so that the chromaticity becomes the chromaticity which is set in advance as a target.

A second aspect of the present invention is a method for driving a light source device which includes a light source emitting light to be irradiated and a chromaticity adjustment part capable of placing/removing a chromaticity adjustment-use filter onto/from the light path of the emitted light and capable of adjusting the chromaticity of the emitted light by placement/removal of the chromaticity adjustment-use filter and which irradiates a target with light, comprising a chromaticity measurement step of measuring the chromaticity of the emitted light emitted by the light source and a control step of monitoring a change of the chromaticity of the emitted light according to the results of measurement of the chromaticity measurement step and controlling placement/removal of the chromaticity adjustment-use filter of the chromaticity adjustment part onto/from the light path so that the chromaticity becomes the chromaticity which is set in advance as a target.

Advantageous Effect of Invention

According to the present invention, light having the same color can be emitted even in the face of changes along with the elapse of time and variations in the specifications of different optical parts.

BRIEF DESCRIPTION OF DRAWINGS

FIGS. 4A and 4B are views for explaining a technical problem in a case of eliminating a variation in color among light source devices by adjusting a light source lamp voltage and calibrating all of the devices to become the same color temperature.

FIGS. 11A to 11C are views for explaining another example of the configuration of a chromaticity adjustment part in a light source device according to an embodiment of the present invention.

FIG. 12 is a view for explaining still another example of the configuration of a chromaticity adjustment part in a light source device according to an embodiment of the present invention.

REFERENCE SIGNS LIST

100 . . . light source device, 101 . . . light source, 102 condenser lens, 103 . . . mechanical slit, 104 . . . ND filter turret, 105 color correction filter turret, 106 . . . half mirror, 107 . . . homogenizer, 108 . . . illuminometer (illuminance measurement part), 109 . . . spectrometer (chromaticity measurement part), 120, 120A, 120B . . . chromaticity adjustment parts, 121 . . . first driving part, 122 . . . second driving part, CHA . . . first chromaticity adjustment-use filter, CHB . . . second chromaticity adjustment-use filter, 131 . . . homogenizer, 132 . . . convex lens, 133 . . . concave lens, 200 . . . light source head, 300 . . . lens barrel, 400 . . . control part, 500 . . . wafer table, 510 . . . reference thermometer, 520 . . . reference color temperature detector, and 530 . . . reference spectrometer.

DESCRIPTION OF EMBODIMENTS

Below, an embodiment of the present invention will be explained with reference to the drawings.

Figure 1:
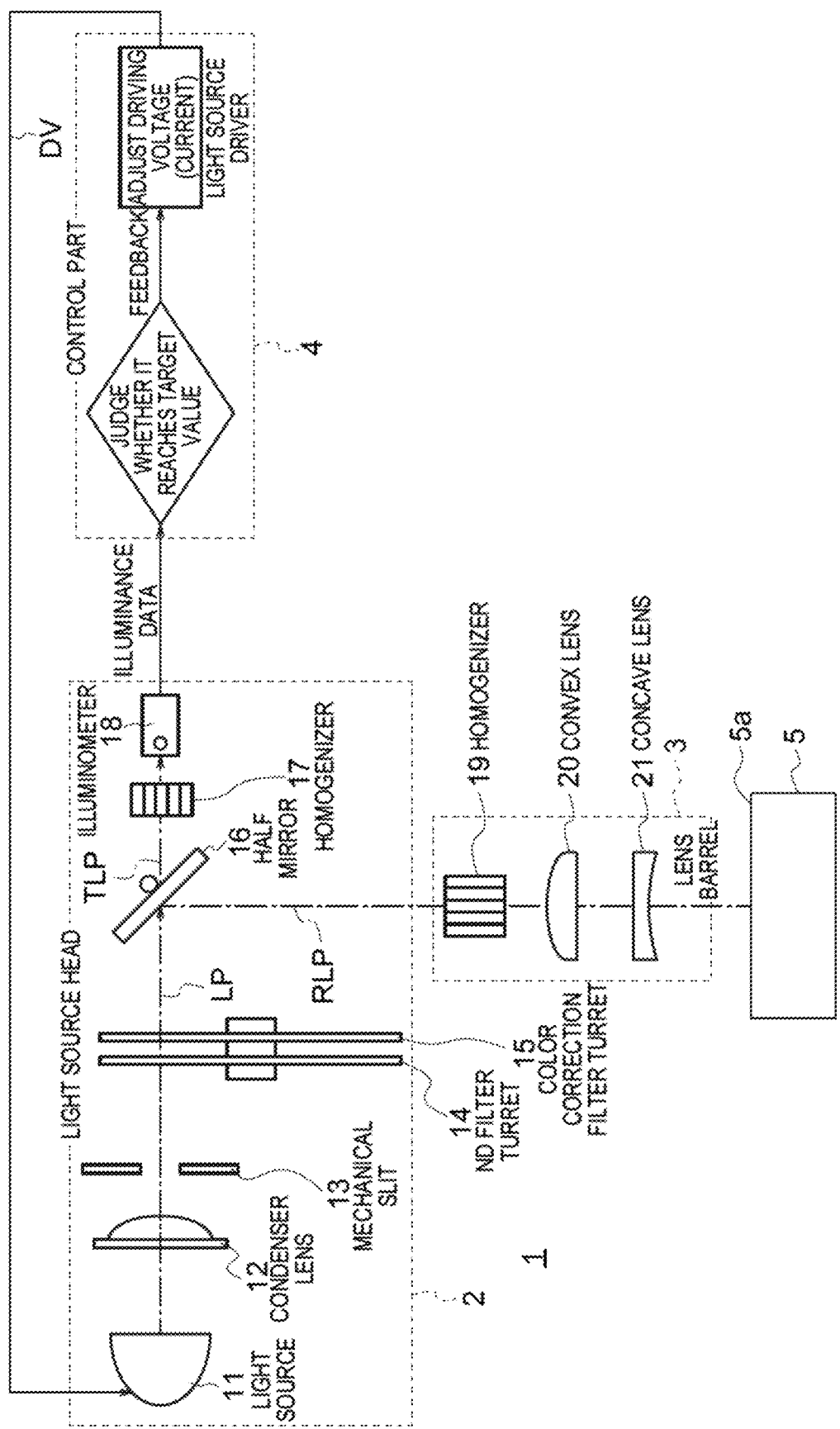
FIG. 1 is a view showing an example of the configuration of a light source device applied to inspection of a solid-state imaging device.
Figure 2:
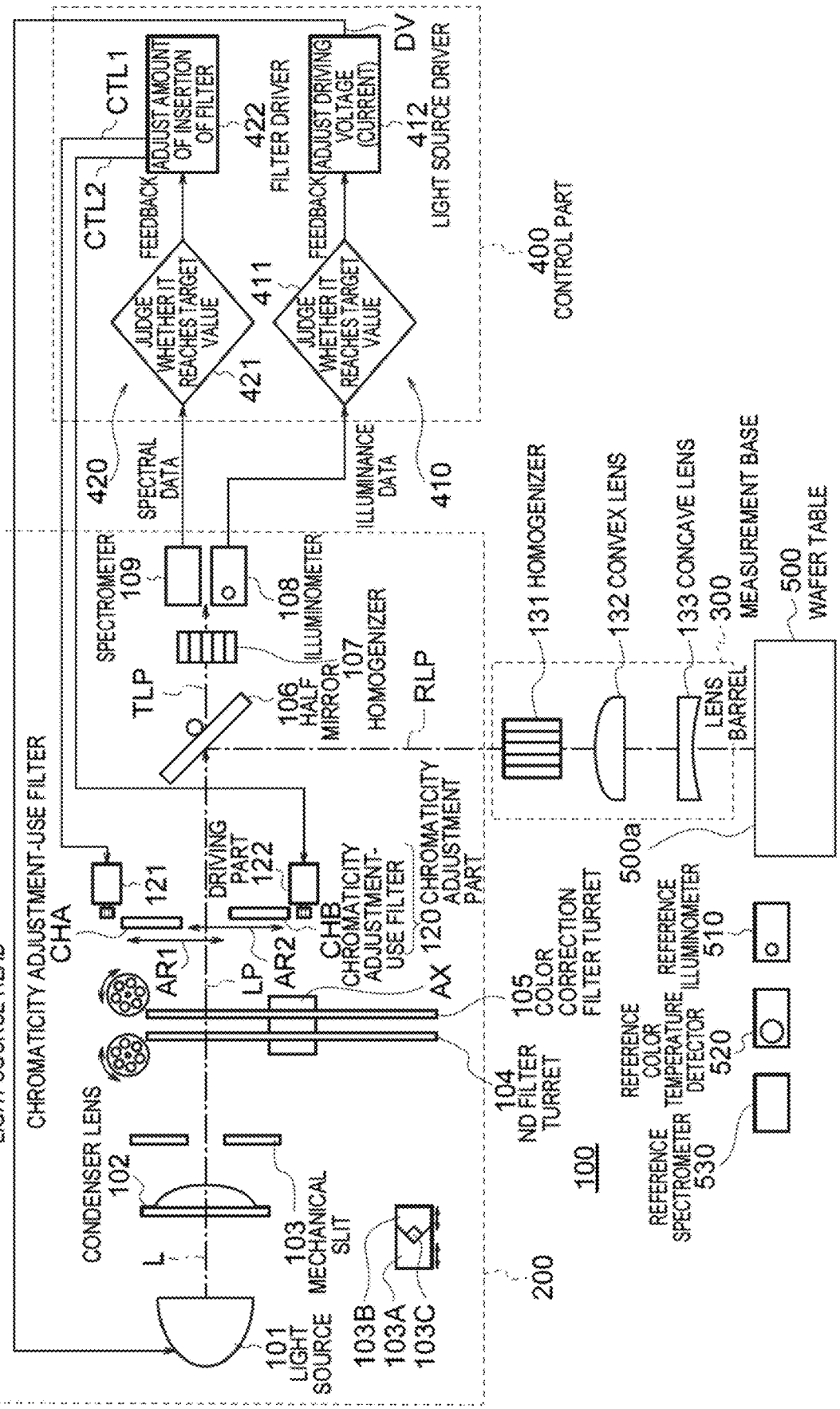
FIG. 2 is a view showing an example of the configuration of a light source device according to an embodiment of the present invention.

FIG. 2 is a view showing an example of the configuration of a light source device according to an embodiment of the present invention.

A light source device 100 according to the present embodiment comprises a light source head 200, lens barrel 300, and control part 400. Further, in the light irradiation region of the lens barrel 300, a wafer table 500 on which a wafer to be inspected is mounted is arranged. A wafer mounting surface 500a of the wafer table 500 is vertical relative to the light path of the optical system in the lens barrel 300. Further, the present system, for inspection, is provided with a reference thermometer 510, reference color temperature detector 520, and reference spectrometer 530.

The light source head 200 includes a light source 101 and, arranged along the transmission light path LP (TLP) of the light (white light) emitted by the light source 101, a condenser lens 102, mechanical slit 103, ND filter turret 104, color correction filter turret 105, half mirror 106, homogenizer 107, illuminance measurement part comprised of an illuminometer 108, chromaticity measurement part comprised of a spectrometer 109, and chromaticity adjustment part 120.

The lens barrel 300 includes a homogenizer 131, convex lens 132, and concave lens 133 which are arranged so as to make their optical axes match with the reflection light path RLP due to the half mirror 106 in the light source head 200. The lens barrel 300 emits light which is adjusted in illuminance and chromaticity in the light source head 200 and propagated along the reflection light path RLP onto the target wafer mounted on the wafer mounting surface 500a of the wafer table 500.

The homogenizers 107 and 131 are configured by fly-eye lenses etc. formed by vertically and horizontally arraying single lenses in a matrix and are provided in order to make the distribution of illuminance of light from the light source 101 uniform.

In the light source head 200, as the light source 101, for example, a halogen lamp, xenon lamp, metal halide lamp, LED, laser, or the like is applied. In the light source 101, a spherical mirror is arranged on the back surface side, and the condenser lens 102 is arranged on the front surface side. The light source 101 is controlled by the driving voltage DV of the control part 400 so that the illuminance becomes the illuminance which is set in advance. The light source 101, in accordance with the driving voltage DV, emits light (white light) L to be emitted to the target wafer which is mounted on the wafer mounting surface 500a of the wafer table 500 toward the condenser lens 102 arranged on the front surface side.

The condenser lens 102 gathers light emitted from the light source 101 and concentrates it in the direction of the mechanical slit 103.

The mechanical slit 103, as shown in FIG. 2, is configured by two movable plates 103A and 103B. The area of an opening 103C formed between them is adjusted by adjustment of movement of the movable plates 103A and 103B. The mechanical slit 103 adjusts the area of the opening 103C to adjust the quantity of the light gathered by the condenser lens 102.

The ND filter turret 104 is supported so that it can rotate about a support axis AX. This ND filter turret 104 holds two or more types of ND (neutral density) filters along its circumferential direction. An ND filter dims the light from the light source 101 passing through the mechanical slit 103 by a predetermined ratio without changing the spectral composition. By rotating the ND filter turret 104 to a specific position, an ND filter having a desired light reducing amount is selected. Note that, the ND filter turret 104 may also be provided with just an opening. When not reducing the light, it allows the light to pass through such an opening as it is.

The color correction filter turret 105 is supported so that it can rotate about the support axis AX. This color correction filter turret 105 holds two or more types of color correction filters along its circumferential direction. By light from the light source 101 passing through a color correction filter, light having a wavelength in accordance with the color of the color correction filter is generated. By rotating the color correction filter turret 105 to a specific position, a desired color correction filter is selected. Note that, the color correction filter turret 105 may also be provided with just an opening through which the light passes. When not selecting the wavelength, it allows the light to pass through this opening as it is.

The half mirror 106 reflects predetermined light (for example light having a predetermined wavelength region) in the light from the light source 101 propagated along the light path LP to form the reflection light path RLP and passes the remaining light therethrough to form the transmission light path TLP. Note that, it is also possible to apply a rotation mirror in place of the half mirror. In this case, it can be configured so as to selectively reflect and supply light to the homogenizers 107 and 131.

The homogenizer 107 is configured by a fly-eye lens etc. formed by vertically and horizontally arraying single lenses in a matrix, evens out the distribution of illuminance of light from the light source 101 passed through the half mirror 106, and supplies the result to the illuminometer 106 and spectrometer 109.

The illuminometer 108 measures the illuminance of the light emitted from the light source 101 and evened out by the homogenizer 107 and outputs the result of measurement to the control part 400.

The spectrometer 109 measures the chromaticity of the light emitted from the light source 101 and evened out by the homogenizer 107 and outputs the result of measurement to the control part 400.

Configuration and Function of Chromaticity Adjustment Part 120

The chromaticity adjustment part 120 is configured so that, under the control of the control part 400, it can place/remove a chromaticity adjustment-use filter onto/from the light path LP of the emitted light (in the present example, onto/from the light path LP between the output side of the color correction filter turret 105 and the reflection surface of the half mirror 106) and can adjust the chromaticity of the emitted light by placement/removal of the chromaticity adjustment-use filter.

The chromaticity adjustment part 120 can place/remove two different types of a first chromaticity adjustment-use filter CHA and a second chromaticity adjustment-use filter CHB onto/from the light path LP of the emitted light. The chromaticity adjustment part 120 adjusts the chromaticity by the amounts of insertion of the two different types of the first chromaticity adjustment-use filter CHA and second chromaticity adjustment-use filter CHB onto the light path LP. In the present embodiment, as an example, the first chromaticity adjustment-use filter CHA is formed by a G filter, and the second chromaticity adjustment-use filter CHB is formed by an LA filter (color temperature conversion filter). The first chromaticity adjustment-use filter CHA and the second chromaticity adjustment-use filter CHB are individually controlled in their amounts of arrangement (here, amounts of insertion or amounts of movement) on the light path LP under the control of the control part 400.

Figure 3:
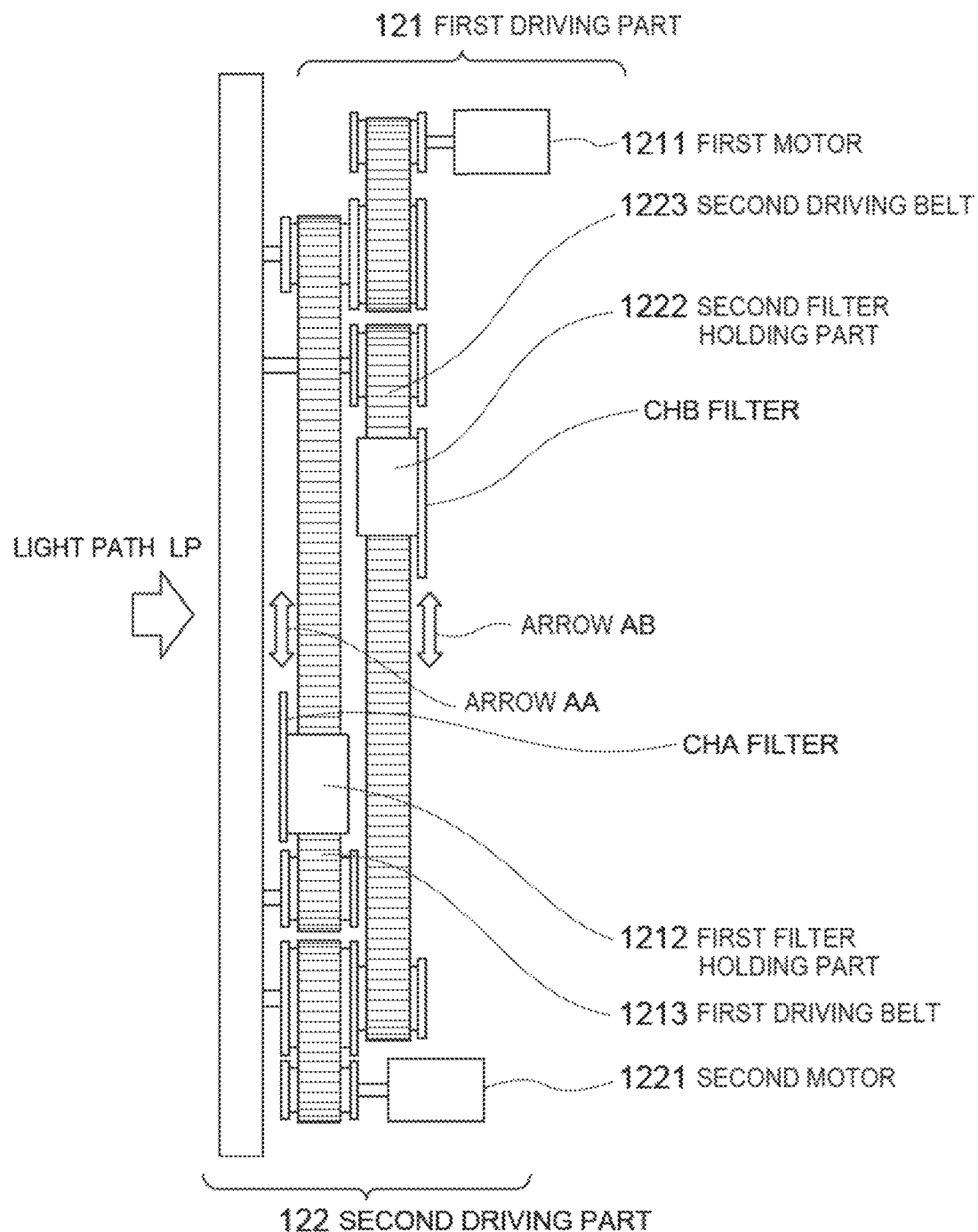
FIG. 3 is a view of an outer appearance including a mechanism of a chromaticity adjustment part according to the present embodiment.

FIG. 3 is a view of an outer appearance including a mechanism of the chromaticity adjustment part according to the present embodiment.

The chromaticity adjustment part 120 has a first driving part 121 for driving the first chromaticity adjustment-use filter CHA and a second driving part 122 for driving the second chromaticity adjustment-use filter CHB. The first driving part 121 is controlled in drive operation by a control signal CLT1 from the control part 400. The second driving part 122 is controlled in drive operation by a control signal CLT2 from the control part 400.

The first driving part 121 includes a first motor 1211 which is controlled in amount of rotation forward and in reverse by the control signal CTL1, a first filter holding part 1212 which holds the first chromaticity adjustment-use filter CHA, a first driving belt 1213 which moves the first filter holding part 1212 in a direction indicated by an arrow AA perpendicular to the light path LP on one side of the light path LP (left side of the light path LP in FIG. 3) as shown in FIG. 3 in accordance with the amount of rotation of the first motor 1211, and so on.

The second driving part 122 includes a second motor 1221 which is controlled in amount of rotation forward and in reverse by the control signal CTL2, a second filter holding part 1222 which holds the second chromaticity adjustment-use filter CHB, a second driving belt 1223 which moves the second filter holding part 1222 in a direction indicated by an arrow AB perpendicular to the light path LP on the other side of the light path LP (right side of the light path LP in FIG. 3) as shown in FIG. 3 in accordance with the amount of rotation of the second motor 1221, and so on.

In the lens barrel 300, the homogenizer 131 is configured by a fly-eye lens formed by vertically and horizontally arraying single lenses in a matrix or the like, evens out the distribution of illuminance of light from the light source 101 which was reflected at the half mirror 106, and supplies the result to the convex lens 132.

The convex lens 132 gathers the light from the light source 101 which was guided from the homogenizer 131. The concave lens 133 diffuses the light so that the distribution of intensity of the light gathered by the convex lens 132 for example becomes uniform, controls the light quantity, illuminance, and distribution of illuminance, and emits the light to the target wafer which is mounted on the wafer mounting surface 500a of the wafer table 500.

Configuration and Function of Control Part 400 The control part 400 has an illuminance control function of using the result of measurement of the illuminance measurement part comprised of the illuminometer 108 to monitor the change of illuminance of the emitted light of the light source 101 and control the driving voltage DV of the light source 101 so that the illuminance becomes the illuminance which is set in advance.

The control part 400, in addition to this illuminance control function, has a chromaticity control function of using the result of measurement of the chromaticity measurement part comprised of the spectrometer 109 to monitor the change of chromaticity of the emitted light of the light source 101 and control placement/removal onto/from the light path LP of the first chromaticity adjustment-use filter CHA and second chromaticity adjustment-use filter CHB in the chromaticity adjustment part 120 so that the chromaticity becomes the chromaticity which is set in advance as the target.

Corresponding to such a configuration, the control part 400 includes an illuminance control part 410 and chromaticity control part 420.

The illuminance control part 410 has an illuminance monitoring part 411 and light source driver 412.

The illuminance monitoring part 411 uses the result of measurement of the illuminometer 108 to monitor the change of illuminance of the emitted light of the light source 101 and judges whether that illuminance has reached the illuminance which is set in advance. The illuminance monitoring part 411 supplies the result of judgment to the light source driver 412.

The light source driver 412, upon receipt of the result of judgment of the illuminance monitoring part 411, controls the driving voltage DV of the light source 101 so that the illuminance of the emitted light of the light source 101 reaches the illuminance which is set in advance if the illuminance of the emitted light of the light source 101 has not reached the illuminance which is set in advance.

Reason for Provision of Chromaticity Control Function Here, the reason for provision of the chromaticity control function in the present embodiment will be explained. In the light source head 200 of the light source device 100 in the present embodiment, the mechanical slit (mechanical aperture) 103 and the ND filter turret 104 which are located on the light path LP are combined in order to emit light having a designated illuminance.

However, a halogen lamp used as the light source 101 falls in illuminance along with the elapse of time. Therefore, in the light source head 200 of the light source device 100, in order to maintain the illuminance, a sensor for measuring the illuminance comprised of an illuminometer 108 is provided inside the light source head 200. Further, using the result of measurement of the illuminometer 108, it is judged in the control part 400 whether the illuminance has reached the target. The driving voltage DV of the lamp is controlled by feedback so that the same value is always obtained, thereby making it possible to keep the same illuminance.

Further, in the light source head 200 in the light source device 100, in order to change the color of the light, a transmission type color correction filter is arranged on the light path LP to change the color of the light as a whole. Further, in the light source device 100, in order to eliminate variation of color in the optical system, it is also possible to adjust the lamp voltage of the light source 101 and adjust the driving voltage DV so that all devices become the same color temperature.

FIGS. 4A and 4B are views for explaining the technical problem in a case of eliminating variation in color in an optical system by adjusting the lamp voltage of the light source 101 and calibrating all devices to become the same color temperature. Even if adjusting the lamp voltage of the light source 101 and adjusting the driving voltage DV so that all devices become the same color temperature in order to eliminate variation in color in the optical system, however, as shown in FIG. 4B, it is difficult to eliminate the variation in color since the color will differ even if the color temperatures are the same.

Therefore, in the present embodiment, for adjusting the color of the light, the method of management of the color is changed from the color temperature to the chromaticity, whereby stricter calibration becomes possible.

Figure 5A:
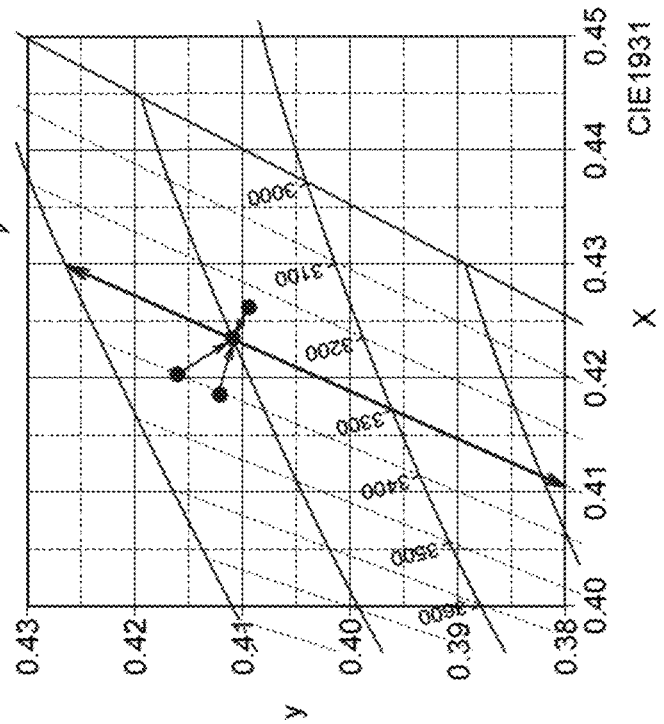
FIGS. 5A and 5B are views for explaining calibration by color temperature and calibration by chromaticity in comparison as a method for managing the color of light.
Figure 5B:
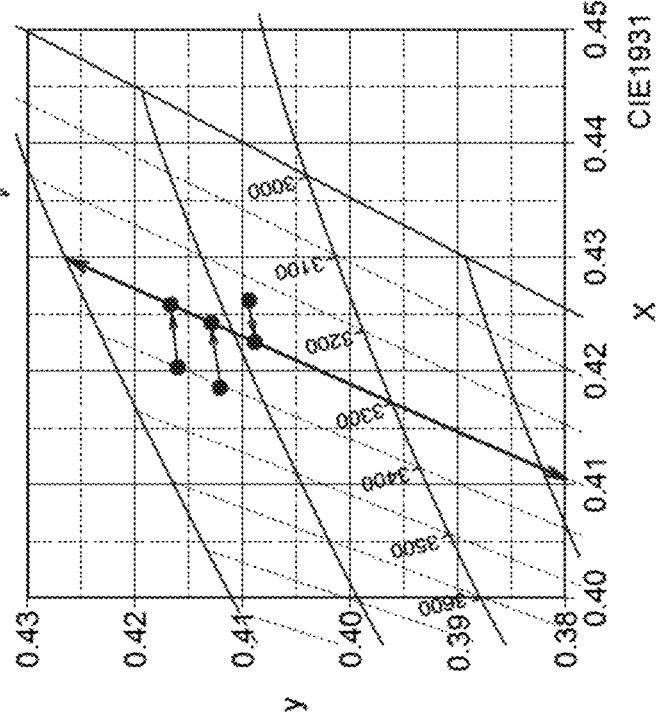

FIGS. 5A and 5B are views for explaining calibration by color temperature and calibration by chromaticity in comparison as methods of management of the color of light. FIG. 5A is a view for explaining calibration by color temperature, while FIG. 5B is a view for explaining calibration by chromaticity.

Calibration by color temperature adjusts the lamp voltage of the light source 101 to correct devices so as to get the same color temperature. However, as shown in FIG. 5A, the color will differ even if the color temperature is the same.

Contrary to this, calibration by chromaticity, adjusts the chromaticity (x,y) under the control of the chromaticity control part 420 to correct devices so as to get any chromaticity. Due to this, in calibration by chromaticity, as shown in FIG. 5B, adjustment to a uniform color becomes possible.

Configuration and Function of Chromaticity Control Part 420

Here, the configuration and function of the chromaticity control part 420 according to the present embodiment will be explained.

The chromaticity control part 420 has a chromaticity monitoring part 421 and filter driver 422.

The chromaticity monitoring part 421 uses the result of measurement of the spectrometer 109 to monitor the change of chromaticity of the light emitted from the light source 101 and judge whether that chromaticity has reached the chromaticity which is set in advance as the target. The chromaticity monitoring part 421 supplies the result of judgment to the filter driver 422.

The filter driver 422 receives the result of judgment of the chromaticity monitoring part 421. If the chromaticity of the light emitted from the light source 101 does not reach the chromaticity which is set in advance as the target, it controls placement/removal of the first chromaticity adjustment-use filter CHA and second chromaticity adjustment-use filter CHB in the chromaticity adjustment part 120 onto/from the light path LP so that the chromaticity becomes the chromaticity which is set in advance as the target so that the chromaticity of the light emitted from the light source 101 reaches the chromaticity which is set in advance.

The filter driver 422 controls the amounts of insertion onto the light path LP of the first chromaticity adjustment-use filter CHA and the second chromaticity adjustment-use filter CHB so that the chromaticity of the emitted light from the light source 101 becomes the chromaticity which is set in advance. The filter driver 422 individually controls the amounts of insertion of the first chromaticity adjustment-use filter CHA and the second chromaticity adjustment-use filter CHB onto the light path LP.

Specifically, the filter driver 422 controls the amount of insertion of the first chromaticity adjustment-use filter CHA onto the light path LP according to the first control signal CTL1. The filter driver 422 outputs the first control signal CTL1 to the first driving part 121 of the chromaticity adjustment part 120 to control the amount of insertion of the first chromaticity adjustment-use filter CHA onto the light path LP. The filter driver 422 controls the amount of insertion of the second chromaticity adjustment-use filter CHB onto the light path LP according to the second control signal CTL2. The filter driver 422 outputs the second control signal CTL2 to the second driving part 122 of the chromaticity adjustment part 120 to control the amount of insertion of the second chromaticity adjustment-use filter CHB onto the light path LP.

Figure 6A:
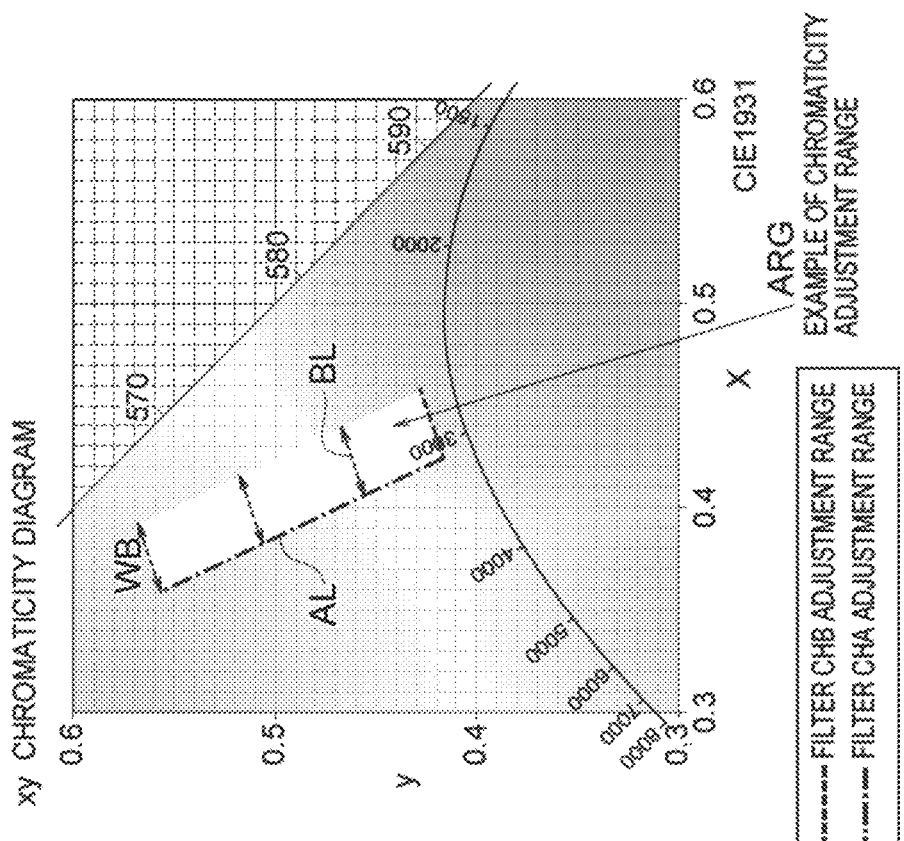
FIGS. 6A and 6B are views for explaining the ranges of adjustment in calibration by color temperature and calibration by chromaticity in comparison as a method for managing the color of light.
Figure 6B:
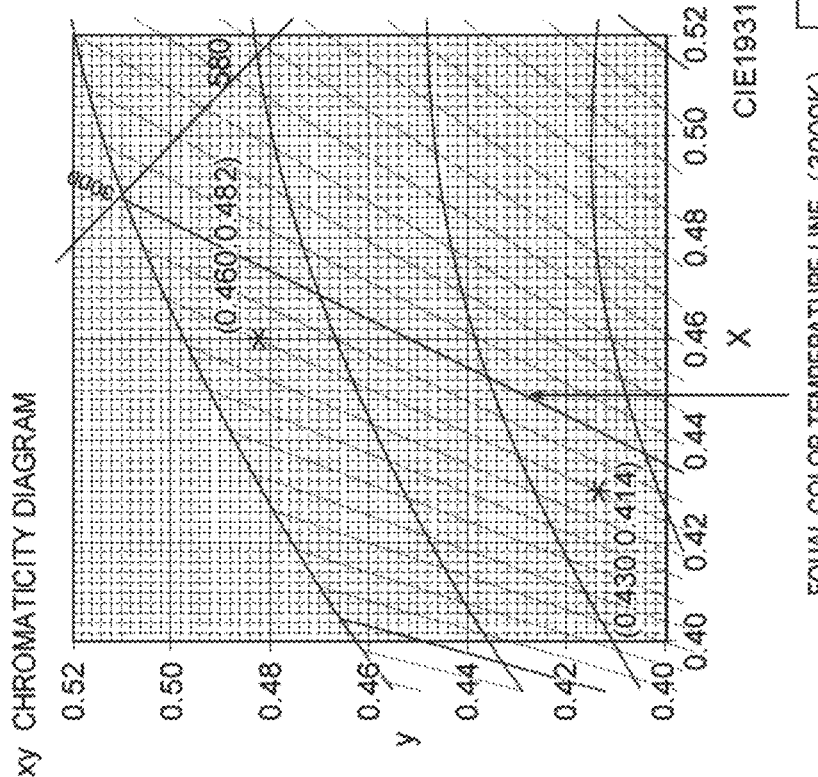

FIGS. 6A and 6B are views for explaining ranges of adjustment in calibration by color temperature and in calibration by chromaticity in comparison as methods of management of the color of the light. FIG. 6A is a view for explaining the range of adjustment in calibration by color temperature, and FIG. 6B is a view for explaining the range of adjustment in calibration by chromaticity.

For the adjustment in calibration by color temperature, the two points indicated by the asterisks * in FIG. 6A indicate the same color temperature (3200K), but different chromaticities (colors). As explained before, in the conventional configuration, the voltage of the light source 101 is adjusted so as to make the color temperatures match (place them onto the same line).

Contrary to this, the range of adjustment in calibration by chromaticity according to the present embodiment is a region indicated by notation ARG in FIG. 6B as an example. The region ARG shown in the figure is an example of the range of possible adjustment of the chromaticity by a combination of the two first chromaticity adjustment-use filter CHA and second chromaticity adjustment-use filter CHB in the chromaticity adjustment part 120.

In the present embodiment, the filter driver 422 of the chromaticity control part 420 in the control part 400, for example, uses the region ARG determined on the xy chromaticity coordinates by a predetermined width WB from above the approximation line AL of the first chromaticity adjustment-use filter CHA as the range of possible adjustment of the chromaticity by a combination of the two different types of filters of the first chromaticity adjustment-use filter CHA and second chromaticity adjustment-use filter CHB so as to thereby control the amounts of insertion of the first chromaticity adjustment-use filter CHA and second chromaticity adjustment-use filter CHB onto the light path LP.

The filter driver 422 can employ the following method as an example of the method of adjustment of the chromaticity. In this method of adjustment of the chromaticity, the filter driver 422, first, sets the amount of insertion of the second chromaticity adjustment-use filter CHB to zero and finds the first approximation line AL of the chromaticity for any of the plurality of amounts of insertion of the first chromaticity adjustment-use filter CHA. Next, it sets the amount of insertion of the first chromaticity adjustment-use filter CHA to any of the plurality of amounts of insertion including zero and finds the second approximation line BL of the chromaticity for any of the plurality of amounts of insertion of the second chromaticity adjustment-use filter CHB for each of the amounts of insertion of the first chromaticity adjustment-use filter CHA. Next, it finds an approximate quadratic curve CL of a second approximate curve BL with respect to the amount of change of the chromaticity "x" of one of "x" and "y" from inclinations of the plurality of second approximation lines BL. Subsequently, it finds chromaticity coordinates including the amount of insertion of the first chromaticity adjustment-use filter CHA at the point S so that the inclination of the straight line connecting any point S on the first approximation line AL and the target point T indicating the target chromaticity and the inclination when finding the approximate curve CL become the same. Further, in a state where the amount of insertion of the first chromaticity adjustment-use filter CHA is fixed, the amount of insertion of the second chromaticity adjustment-use filter CHB is adjusted and is made to match the color coordinate of the target point T.

Next, a concrete example of processing of the above chromaticity adjustment method will be explained as a concrete calibration procedure of the color by the first chromaticity adjustment-use filter CHA and second chromaticity adjustment-use filter CHB according to the present embodiment with reference to FIGS. 7A to 7F to FIG. 10.

Figure 7A:
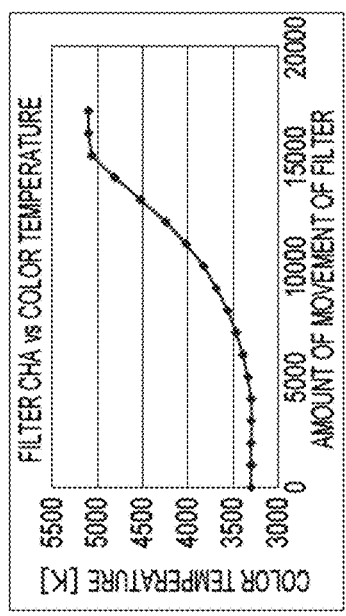
FIGS. 7A to 7F are views showing an example of the change in color temperature and chromaticity due to movement (insertion into the light path) of a first chromaticity adjustment-use filter and second chromaticity adjustment-use filter according to the present embodiment.
Figure 7B:
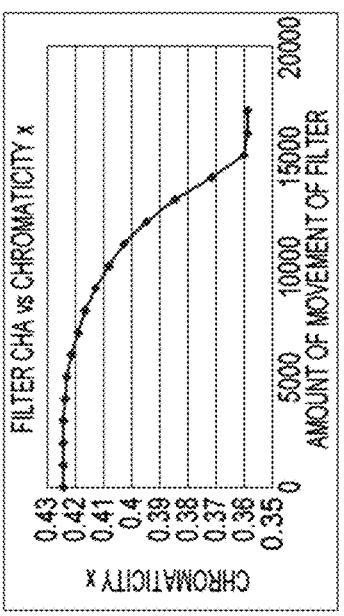
Figure 7C:
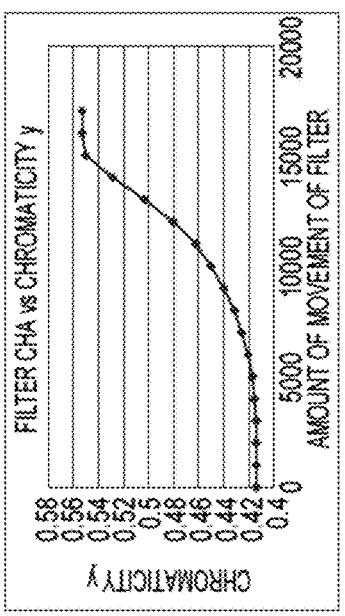
Figure 7D:
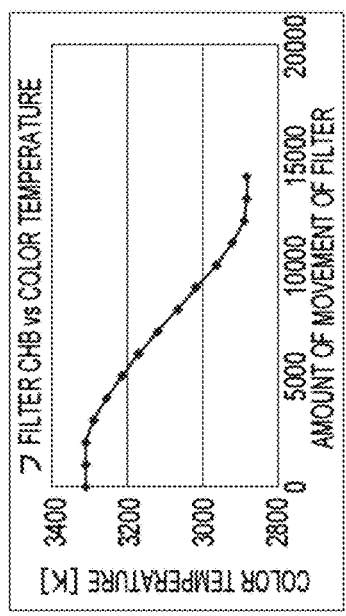
Figure 7E:
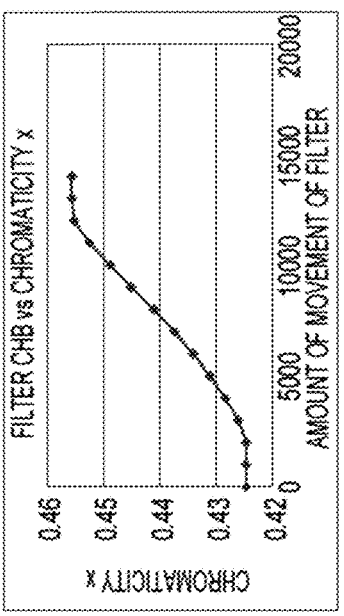
Figure 7F:
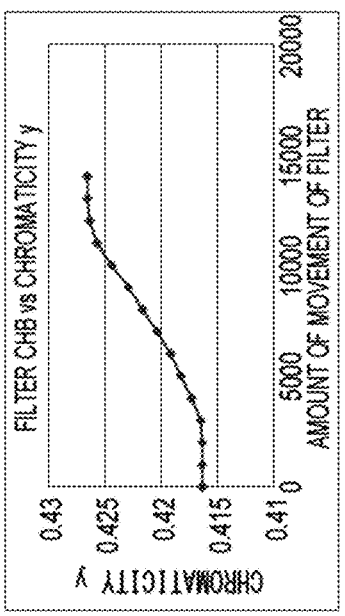

FIGS. 7A to 7F are views showing examples of the change of the color temperature and chromaticity due to movement (insertion to the light path LP) of the first chromaticity adjustment-use filter CHA and second chromaticity adjustment-use filter CHB according to the present embodiment. FIG. 7A shows an example of the change of the color temperature due to movement (insertion to the light path LP) of the first chromaticity adjustment-use filter CHA, FIG. 7B shows an example of the change of the chromaticity "x" due to movement (insertion to the light path LP) of the first chromaticity adjustment-use filter CHA, and FIG. 7C shows an example of the change of the chromaticity "y" due to movement (insertion to the light path LP) of the first chromaticity adjustment-use filter CHA. FIG. 7D shows an example of the change of the color temperature due to movement (insertion to the light path LP) of the second chromaticity adjustment-use filter CHB, FIG. 7E shows an example of the change of the chromaticity "x" due to movement (insertion to the light path LP) of the second chromaticity adjustment-use filter CHB, and FIG. 7F shows an example of the change of the chromaticity "y" due to movement (insertion to the light path LP) of the second chromaticity adjustment-use filter CHB.

Figure 8:
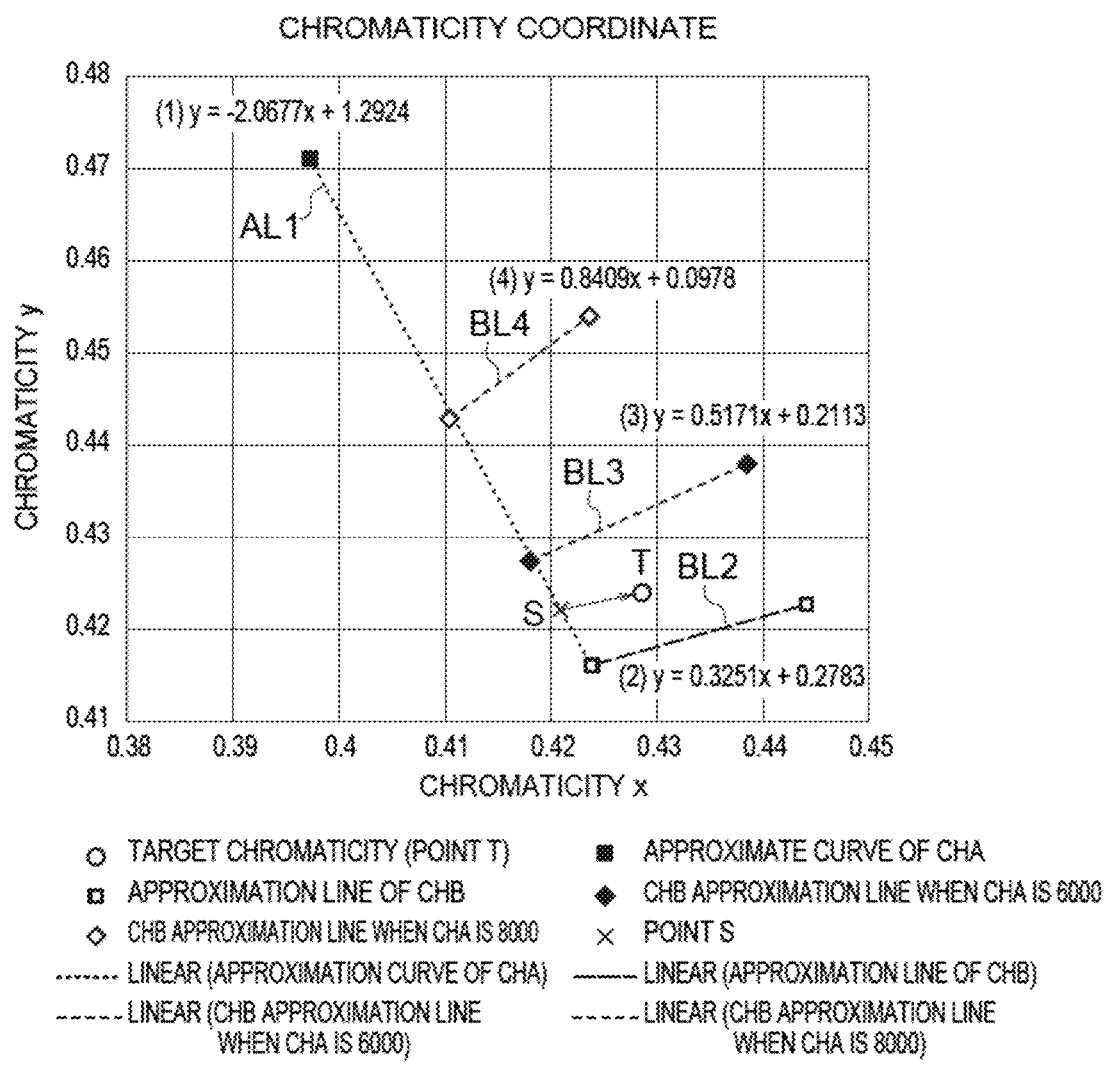
FIG. 8 is a chromaticity coordinate diagram for explaining a concrete calibration procedure of color by the first chromaticity adjustment-use filter and second chromaticity adjustment-use filter according to the present embodiment.
Figure 9:
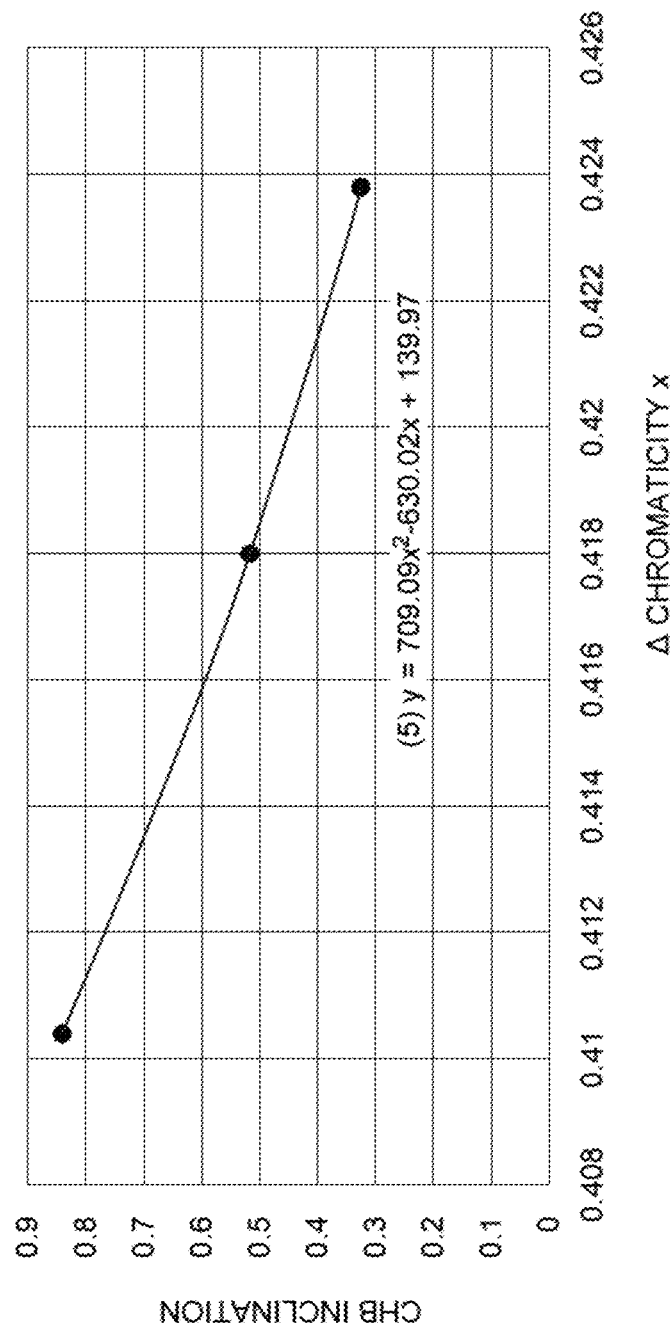
FIG. 9 is a view for explaining processing for finding an approximate quadratic curve of a second approximation curve with respect to the amount of change of chromaticity from inclinations of a plurality of second approximation lines.
Figure 10:
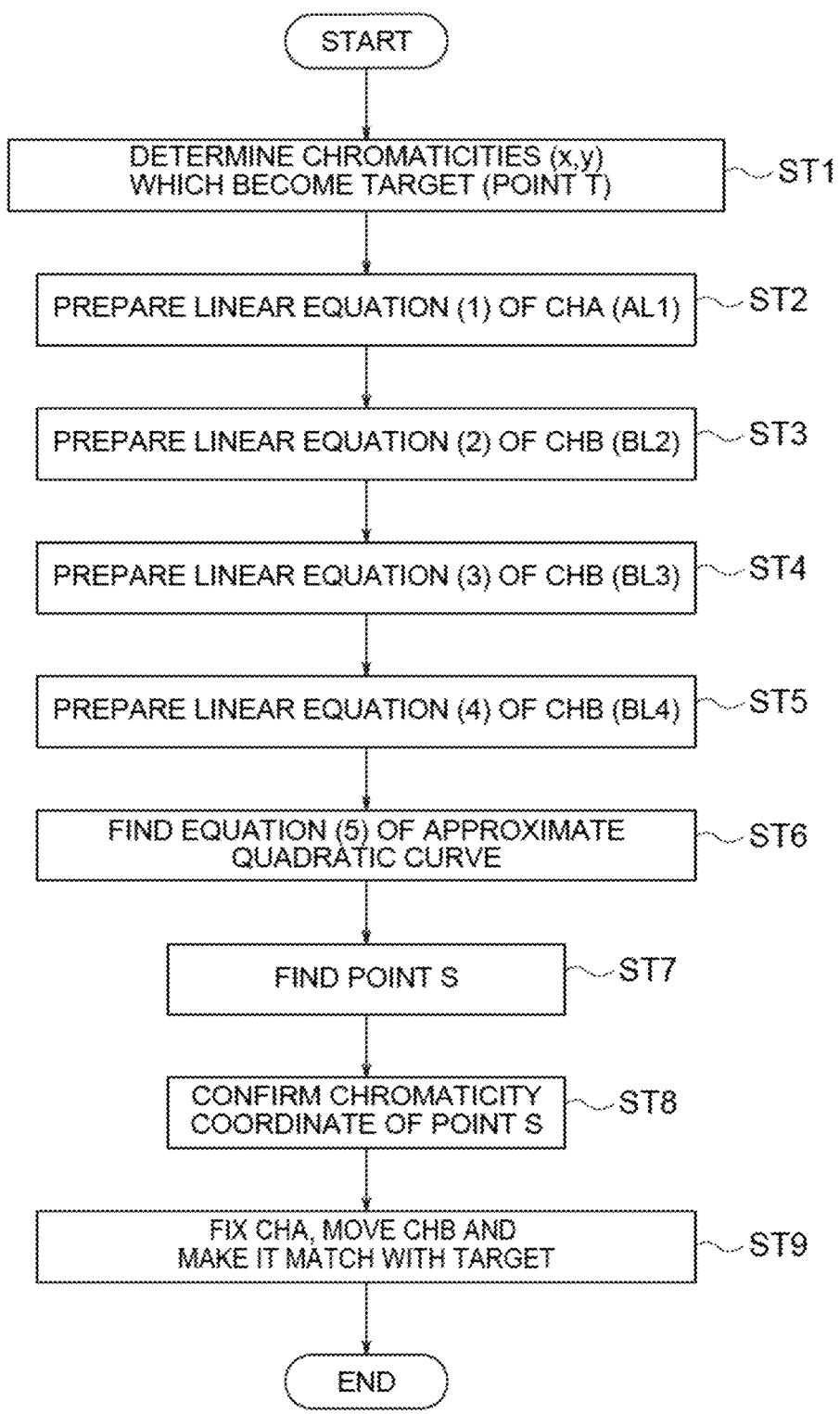
FIG. 10 is a flow chart for explaining a concrete calibration procedure of color by the first chromaticity adjustment-use filter and second chromaticity adjustment-use filter according to the present embodiment.

FIG. 8 is a chromaticity coordinate diagram for explaining a concrete calibration procedure of color by the first chromaticity adjustment-use filter CHA and second chromaticity adjustment-use filter CHB according to the present embodiment. FIG. 9 is a view for explaining processing for finding the approximate quadratic curve CL of the second approximate curve BL with respect to the amount of change of the chromaticity "x" from the inclinations of the plurality of second approximation lines BL. FIG. 10 is a flow chart for explaining a concrete calibration procedure of color by the first chromaticity adjustment-use filter CHA and second chromaticity adjustment-use filter CHB according to the present embodiment.

Example of Calibration Procedure by Chromaticity Adjustment-Use Filters CHA and CHB In the present embodiment, use is made of the two types of filters of the first chromaticity adjustment-use filter CHA and second chromaticity adjustment-use filter CHB.

Step ST1

At step ST1, the target chromaticities (x,y) are determined by the specifications of the device. As an example, the following values are employed (point T).

TABLE 1

| x | y |
|---|---|
| 0.4286 | 0.424 |

Step ST2

At step ST2, the amount of insertion of the second chromaticity adjustment-use filter CHB is set to 0 and the approximation linear equation (1) of the chromaticity (straight line AL1) is formed as shown in FIG. 8 by two points of any amount of insertion, i.e. (CHA, CHB)=(0,0) and (10000,0) of the first chromaticity adjustment-use filter CHA. For the measurement of the chromaticity, on the wafer table (measurement base) 500, use is made of the reference color temperature detector 520.

TABLE 2

| CHA | CHB | x | y |
|---|---|---|---|
| 0 | 0 | 0.4238 | 0.4161 |
| 10000 | 0 | 0.3972 | 0.4711 |

(1) $y = -2.0677x + 1.2924$

Step ST3

At step ST3, the amount of insertion of the first chromaticity adjustment-use filter CHA is set to 0, and the approximation linear equation (2) of the chromaticity (straight line BL2) is formed as shown in FIG. 8 by two points of any amount of insertion, i.e. (CHA, CHB)=(0, 0) and (10000, 0) of the second chromaticity adjustment-use filter CHB.

TABLE 3

| CHA | CHB | x | y |
|---|---|---|---|
| 0 | 0 | 0.4238 | 0.4161 |
| 0 | 10000 | 0.4441 | 0.4227 |

(2) $y = 0.3251x + 0.2783$

Step ST4

At step ST4, the amount of insertion of the first chromaticity adjustment-use filter CHA is set to 6000, and the approximation linear equation (3) of the chromaticity (straight line BL3) is formed as shown in FIG. 8 by two points of any amount of insertion, i.e. (CHA, CHB)=(6000, 0) and (6000, 9000) of the second chromaticity adjustment-use filter CHB.

TABLE 4

| CHA | CHB | x | y |
|---|---|---|---|
| 6000 | 0 | 0.418 | 0.4274 |
| 6000 | 9000 | 0.4385 | 0.438 |

(3) $y = 0.5171x + 0.2113$

Step ST5

At step ST5, the amount of insertion of the first chromaticity adjustment-use filter CHA is set to 8000, and the approximation linear equation (4) of the chromaticity (straight line BL4) is formed as shown in FIG. 8 by two points of any amount of insertion, i.e. (CHA, CHB)=(8000, 0) and (8000, 7000) of the second chromaticity adjustment-use filter CHB.

TABLE 5

| CHA | CHB | x | y |
|---|---|---|---|
| 8000 | 0 | 0.4104 | 0.4429 |
| 8000 | 7000 | 0.4236 | 0.454 |

(4) $y = 0.8409x + 0.0978$

Step ST6

At step ST6, as shown in FIG. 9, equation (5) of the approximate quadratic curve CL of "chromaticity x change vs CHB inclination" is found from the inclinations of equations (2) to (4).

TABLE 6

| | Chromaticity "x" | CHB inclination |
|---|---|---|
| CHA0 | 0.4238 | 0.3251 |
| CHA6000 | 0.418 | 0.5171 |
| CHA8000 | 0.4104 | 0.8409 |

(5) $y = 709.09x^2 - 630.02x + 139.97$

Step ST7

At step ST7, the point S is found so that the inclination of the straight line connecting the point S on the approximation line AL1 of the first chromaticity adjustment-use filter CHA and the target chromaticity (point T) and the inclination found in equation (5) become the same.

TABLE 7

| | Chromaticity "x" | Chromaticity "y" |
|---|---|---|
| Point T | 0.4286 | 0.424 |
| Point S | x | −2.0677x + 1.2924 |

(6) Inclination: $a = (0.424-(-2.0677x + 1.2924))/(0.4286 - x)$

Step ST8

At step ST8, when equation (6) is solved, the chromaticity coordinates of the point S become as follows:

TABLE 8

|        | Chromaticity "x" | Chromaticity "y" | CHA  |
|--------|------------------|------------------|------|
| Point S| 0.4209           | 0.4221           | 4700 |

Step ST9

At step ST9, the amount of insertion of the first chromaticity adjustment-use filter CHA is fixed to 4700, and the second chromaticity adjustment-use filter CHB can be moved and made match with the target.

TABLE 9

|        | CHA  | CHB  | Chromaticity "x" | Chromaticity "y" |
|--------|------|------|------------------|------------------|
| Point T| 4700 | 6350 | 0.4285           | 0.4244           |

0.4286 0.424

Note that, as the specific units of the amounts of insertion of the filters described above, for example, the numbers of conveying steps at the stepping motors configuring a first motor 1211 and second motor 1221 may be used. The numbers of steps can be converted to distances from the amounts of movement per step of the motors calculated from the configurations of the movement mechanisms of the filters. As an example, as indicated, if the amounts of movement per step are 0.02 mm/step, in the case where the amounts of insertion of first chromaticity adjustment-use filter CHA and second chromaticity adjustment-use filter CHB (CHA, CHB) are (6000, 9000), the first chromaticity adjustment-use filter CHA is inserted by 120 mm and the second chromaticity adjustment-use filter CHB is inserted by 180 mm from the origin positions of the filters CHA and CHB.

By performing the chromaticity adjustment processing as explained above, the colors of light among all devices and among the designated illuminances and, further, due to changes of the lamps along with the elapse of time can be made the same.

Next, the entire operation of the light source device 100 having the above configuration will be explained in brief.

In the light source device 100, the light source 101 is controlled by the driving voltage VD from the control part 400 so that its illuminance becomes the illuminance which is set in advance. In the light source 101, in accordance with the driving voltage DV, the light (white light) L which should be emitted to the target wafer which is mounted on the wafer mounting surface 500a of the wafer table 500 is emitted toward the condenser lens 102 which is arranged on the front surface side.

The light L emitted by the light source 101 is gathered in luminous flux at the condenser lens 102 and is concentrated in the direction of the mechanical slit 103. In the mechanical slit 103, the area of the opening 103C is adjusted to adjust the quantity of the light focused at the condenser lens 102. At the ND filter turret 104, for example, an ND filter having a desired light reduction amount is selected. The light transmitted through the ND filter is supplied to the color correction filter turret 105. Further, at the color correction filter turret 105, the desired color correction filter is selected. The light passed through the color correction filter is propagated along the light path LP and is made to strike the half mirror 106.

At the half mirror 106, light having a predetermined wavelength region in the light from the light source 101 propagated along the light path LP is reflected and propagated along the reflection light path RLP then is made to strike the homogenizer 131 in the lens barrel 300. The light in the remaining wavelength region is transmitted through the half mirror and propagated along the transmission light path TLP, then is made to strike the homogenizer 107.

In the homogenizer 131 in the lens barrel 300, the distribution of illuminance of the light from the light source 101 which was reflected at the half mirror 106 is evened out, then the light is supplied to the convex lens 132 and focused. Next, for example, the light is diffused so that the distribution of intensity of the focused light becomes uniform and is irradiated to the target wafer mounted on the wafer mounting surface 500a of the wafer table 500 while being controlled in quantity, illuminance, and distribution of illuminance.

On the other hand, at the homogenizer 107, the distribution of illuminance of the light from the light source 101 which passed through the half mirror 106 is evened out. The light is then supplied to the illuminometer 108 and spectrometer 109. In the illuminometer 108, the illuminance of the light emitted by the light source and supplied by the homogenizer 107 is measured, and the result of measurement is output to the control part 400. On the other hand, in the spectrometer 109, the chromaticity of the light emitted from the light source and supplied by the homogenizer 107 is measured, and the result of measurement is output to the control part 400.

The control part 400 monitors the change of the illuminance of the emitted light of the light source 101 according to the result of measurement of the illuminance measurement part constituted by the illuminometer 108 and controls the driving voltage DV of the light source 101 so that the illuminance becomes the illuminance which is set in advance. Further, the control part 400 monitors the change of the chromaticity of the emitted light of the light source 101 according to the result of measurement of the chromaticity measurement part constituted by the spectrometer 109 and controls the placement/removal onto/from the light path LP of the first chromaticity adjustment-use filter CHA and second chromaticity adjustment-use filter CHB in the chromaticity adjustment part 120 so that the chromaticity becomes the chromaticity which is set in advance as the target.

In this way, the light controlled so that the illuminance and chromaticity become the targets is propagated along the light path LP and is made to strike the half mirror 106. In the half mirror 106, as explained above, the light of a predetermined wavelength region in the light of the light source 101 which was propagated along the light path LP is reflected and is propagated along the reflection light path RLP and is made to strike the homogenizer 131 in the lens barrel 300, while the light in the remaining wavelength region is transmitted and propagated along the transmission light path TLP and is made to strike the homogenizer 107.

Further, in the homogenizer 131 in the lens barrel 300, the illuminance and chromaticity is controlled, the illuminance distribution of the light from the light source 101 which was reflected at the half mirror 106 is evened out, and the result is supplied to the convex lens 132 and focused. After that, the light is for example diffused so that the distribution of intensity of the focused light becomes uniform and is irradiated to the target wafer mounted on the wafer mounting surface 500a of the wafer table 500 while being controlled in quantity, illuminance, and distribution of illuminance.

As explained above, according to the present embodiment, the light source device 100 comprises a light source 101 which emits light (white light) L to be irradiated to a target wafer mounted on a wafer mounting surface 500a of a wafer table 500 toward a condenser lens 102 arranged on the front surface side in accordance with a driving voltage DV, a chromaticity adjustment part 120 capable of placing/removing two different types of filters of a first chromaticity adjustment-use filter CHA and second chromaticity adjustment-use filter CHB onto/from a light path LP of emitted light (in the present example, on a light path LP between the output side of the color correction filter turret 105 and the reflection surface of the half mirror 106) and capable of adjusting the chromaticity of the emitted light by placement/removal of the chromaticity adjustment-use filters, and a control part 400 which monitors a change of chromaticity of the emitted light of the light source 101 according to the result of measurement of a chromaticity measurement part constituted by a spectrometer 109 and controls placement/removal onto/from the light path LP of the first chromaticity adjustment-use filter CHA and second chromaticity adjustment-use filter CHB in the color adjustment part 120 so that the monitored chromaticity becomes the chromaticity which is set in advance as the target.

In this way, the light source device 100 in the present embodiment is configured so that a sensor capable of measuring the chromaticity is arranged inside the light source head, change along with the elapse of time of the color of the light of for example a halogen lamp is monitored, the monitored result is fed back to the color adjustment part, and light having the same color despite the change along with the elapse of time can be irradiated. Due to this, according to the present embodiment, the color (chromaticity) of the light can be made the same among all devices, among designated illuminances, and despite the change along with the elapse of time of the lamps.

Further, according to the present embodiment, the amount of insertion of the first chromaticity adjustment-use filter CHA and the amount of insertion of the second chromaticity adjustment-use filter CHB are individually controlled linked with the approximation lines on the chromaticity coordinates so that the chromaticity set as the target is obtained, therefore adjustment of chromaticity with a high precision can be realized.

Note that, naturally the present invention is not limited to the embodiment explained above. For example, the chromaticity adjustment part is not limited to the configuration in FIG. 2 and FIG. 3. The configuration as shown below can be employed.

Another Example of Configuration of Chromaticity Adjustment Part

FIGS. 11A to 11C are diagrams for explaining another example of the configuration of the chromaticity adjustment part in the light source device according to an embodiment of the present invention.

In this chromaticity adjustment part 120A, a disk-shaped first chromaticity adjustment-use transmission filter turret TCHA and a second chromaticity adjustment-use transmission filter turret TCHB given gradations in the circumferential direction are placed on the light path LP. The chromaticity is calibrated with the use of the amounts of rotation of the two, i.e., the first chromaticity adjustment-use transmission filter turret TCHA and the second chromaticity adjustment-use transmission filter turret TCHB.

The first chromaticity adjustment-use transmission filter turret TCHA and second chromaticity adjustment-use transmission filter turret TCHB, as shown in FIG. 11A, are supported on the light path LP so that they can rotate about the coaxial rotation axis RAX.

The calibration of chromaticity by the amounts of rotation of the first chromaticity adjustment-use transmission filter turret TCHA and second chromaticity adjustment-use transmission filter turret TCHB corresponds to control of the amounts of arrangement of the chromaticity adjustment-use transmission filters on the light path LP.

In this case as well, the color (chromaticity) of the light can be made the same among all devices, among designated illuminances, and despite the change along with the elapse of time of the lamps.

FIG. 12 is a view for explaining still another example of the configuration of the chromaticity adjustment part in the light source device according to the embodiment of the present invention.

In a chromaticity adjustment part 120B in FIG. 12, a chromaticity adjustment-use filter CHC given gradations of chromaticity in each of the X-direction and Y-direction is placed on the light path LP, and the chromaticity is calibrated with the use of the amounts of movement (amounts of arrangement) to the X-direction and Y-direction.

In this case as well, the color (chromaticity) of the light can be made the same among all devices, among designated illuminances, and despite the change along with the elapse of time of the lamps.

Further, as another chromaticity adjustment part, it is also possible to employ the following configuration. This chromaticity adjustment part has chromaticity adjustment-use filters CHA and CHB which have the functions being able to be electrically changed in their densities and calibrates the chromaticity according to the voltage (current) applied to the filters.

In this case as well, the color (chromaticity) of the light can be made the same among all devices, among designated illuminances, and despite the change along with the elapse of time of the lamps.

Note that, the method explained in detail above may also be configured formed as a program corresponding to the above routine and run by a CPU or other computer. Further, such a program can be configured so that a semiconductor memory, magnetic disk, optical disk, floppy (registered trademark) disk, or other recording medium is accessed by a computer in which this recording medium is set so that the above program is run.

The invention claimed is:

1. A light source device for irradiating a target device with light, comprising:
 a light source which emits the light to irradiate the target device;
 a sensor measuring a chromaticity of the emitted light emitted by the light source;
 a driver driving a first chromaticity filter and a second chromaticity filter onto and from a light path of the emitted light; and
 a processor configured to monitor a change of the chromaticity of the emitted light according to the chromaticity measured by the sensor and to control the driving by the driver to adjust positioning of the first chromaticity filter and the second chromaticity filter onto and from the light path to maintain the chromaticity at a preset target chromaticity by setting a region determined on chromaticity coordinates with a predetermined width from above an approximation line of the first chromaticity filter as a range enabling adjustment of the chromaticity by a combination of the first chromaticity filter and the second chromaticity filter.

2. The light source device according to claim 1, wherein the first chromaticity filter and the second chromaticity filter are two different types of filters.

3. The light source device according to claim 1,
wherein the positioning of the first chromaticity filter and the second chromaticity filter includes insertion of the first chromaticity filter and the second chromaticity filter onto the light path, and
wherein the processor is further configured to
set an amount of insertion of the second chromaticity filter to 0 to find a first approximation line of the chromaticity with any plurality of amounts of insertion of the first chromaticity filter,
set the amount of insertion of the first chromaticity filter to any plurality of amounts of insertion including 0 to find a second approximation line of the chromaticity with any plurality of amounts of insertion of the second chromaticity filter for each of the amounts of insertion of the first chromaticity filter,
find an approximate quadratic curve of the second approximate curve for one amount of change of chromaticity from inclinations of the plurality of second approximation lines,
find chromaticity coordinates including the amount of insertion of the first chromaticity filter at a point S so that an inclination of a straight line connecting any point S on the first approximation line and a target point T showing the target chromaticity and an inclination when finding the approximate curve become the same, and
adjust the amount of insertion of the second chromaticity filter and to match with the chromaticity coordinates of the target point T in a state where the amount of insertion of the first chromaticity filter is fixed.

4. The light source device according to claim 1,
wherein each of the first chromaticity filter and the second chromaticity filter is a disk-shaped transmission filter turret with gradations in the circumferential direction arranged on the light path, and
wherein the positioning of the first chromaticity filter and the second chromaticity filter includes respective rotation of the transmission filter turret.

5. The light source device according to claim 1,
wherein the first chromaticity filter and the second chromaticity filter are combined in a chromaticity filter having a gradation of chromaticity in each of an X-direction and a Y-direction, and
wherein the positioning of the first chromaticity filter and the second chromaticity filter includes movement of the chromaticity filter having the gradation of chromaticity in each of the X-direction and the Y-direction.

6. The light source device according to claim 1,
wherein the positioning of the first chromaticity filter and the second chromaticity filter includes electrically changing a density respectively of each of the first chromaticity filter and the second chromaticity filter in the light path of the emitted light, and
wherein the control of the driving of the driver to adjust the positioning of the first chromaticity filter and the second chromaticity filter includes controlling an amount of voltage or current which is applied to the first chromaticity filter and the second chromaticity filter.

7. The light source device according to claim 1,
further comprising another sensor measuring an illuminance of the emitted light emitted by the light source, and
wherein the processor is further configured to monitor a change of the illuminance of the emitted light based on the measuring by the another sensor and to control a driving voltage of the light source to maintain the illuminance at a preset target illuminance.

8. A method for driving a light source device which includes a light source emitting light to irradiate a target wafer and a driver driving a first chromaticity filter and a second chromaticity filter onto and from a light path of the emitted light, the method comprising:
a chromaticity measurement step of measuring a chromaticity of the emitted light emitted by the light source; and
a control step of monitoring a change of the chromaticity of the emitted light according to the chromaticity measured by the sensor and controlling the driving by the driver to adjust positioning of the first chromaticity filter and the second chromaticity filter onto and from the light path to maintain the chromaticity at a preset target chromaticity by setting a region determined on chromaticity coordinates with a predetermined width from above an approximation line of the first chromaticity filter as a range enabling adjustment of the chromaticity by a combination of the first chromaticity filter and the second chromaticity filter.

9. The method for driving the light source device according to claim 8, wherein the first chromaticity chromaticity filter and the second chromaticity filter are two different types of filters.

10. The method for driving the light source device according to claim 8,
wherein the positioning of the first chromaticity filter and the second chromaticity filter includes insertion of the first chromaticity filter and the second chromaticity filter onto the light path, and
wherein the control step further includes
sets the setting an amount of insertion of the second chromaticity adjustment use filter to 0 to find a first approximation line of the chromaticity with any plurality of amounts of insertion of the first chromaticity filter,
setting the amount of insertion of the first chromaticity filter to any plurality of amounts of insertion including 0 to find a second approximation line of the chromaticity with any plurality of amounts of insertion of the second chromaticity filter for each of the amounts of insertion of the first chromaticity filter,
finding an approximate quadratic curve of the second approximate curve for one amount of change of chromaticity from inclinations of the plurality of second approximation lines,
finding chromaticity coordinates including the amount of insertion of the first chromaticity filter at a point S so that an inclination of a straight line connecting any point S on the first approximation line and a target point T showing the target chromaticity and an inclination when finding the approximate curve become the same, and
adjusting the amount of insertion of the second chromaticity filter and to match with the chromaticity coordinates of the target point T in a state where the amount of insertion of the first chromaticity filter is fixed.

11. The method for driving the light source device according to claim 8,
- wherein each of the first chromaticity filter and the second chromaticity filter is a disk-shaped transmission filter turret with gradations in the circumferential direction arranged on the light path, and,
- wherein the positioning of the first chromaticity filter and the second chromaticity filter includes respective rotation of the transmission filter turret.

12. The method for driving the light source device according to claim 8,
- wherein the first chromaticity filter and the second chromaticity filter are combined in a chromaticity filter having a gradation of chromaticity in each of an X-direction and a Y-direction, and,
- wherein the positioning of the first chromaticity filter and the second chromaticity filter includes movement of the chromaticity filter having the gradation of chromaticity in each of the X-direction and the Y-direction.

13. The method for driving the light source device according to claim 8,
- wherein the positioning of the first chromaticity filter and the second chromaticity filter includes electrically changing a density respectively of each of the first chromaticity filter and the second chromaticity filter in the light path of the emitted light, and
- wherein the controlling of the driving of the driver to adjust the positioning of the first chromaticity filter and the second chromaticity filter includes controlling an amount of voltage or current which is applied to the first chromaticity filter and the second chromaticity filter.

* * * * *